United States Patent
Tanghe et al.

(10) Patent No.: US 11,387,316 B2
(45) Date of Patent: Jul. 12, 2022

(54) MONOLITHIC BACK-TO-BACK ISOLATION ELEMENTS WITH FLOATING TOP PLATE

(71) Applicant: Analog Devices International Unlimited Company, Limerick (IE)

(72) Inventors: Steven Tanghe, Essex Junction, VT (US); Patrick M. McGuinness, Limerick (IE)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 16/700,370

(22) Filed: Dec. 2, 2019

(65) Prior Publication Data

US 2021/0167169 A1 Jun. 3, 2021

(51) Int. Cl.
*H01L 29/06* (2006.01)
*H01L 23/495* (2006.01)

(52) U.S. Cl.
CPC .... *H01L 29/0649* (2013.01); *H01L 23/49589* (2013.01)

(58) Field of Classification Search
CPC ..................................................... H01L 23/538
See application file for complete search history.

(56) References Cited

U.S. PATENT DOCUMENTS

| | | |
|---|---|---|
| 5,354,695 A | 10/1994 | Leedy |
| 5,512,774 A | 4/1996 | Nakagawa et al. |
| 5,684,660 A | 11/1997 | Gray et al. |
| 5,969,590 A | 10/1999 | Gutierrez |
| 6,448,536 B2 | 9/2002 | Li et al. |
| 6,512,437 B2 | 1/2003 | Jin et al. |
| 6,927,662 B2 | 8/2005 | Kahlmann et al. |
| 7,282,789 B2 | 10/2007 | Kinsman |
| 7,489,526 B2 | 2/2009 | Chen et al. |
| 7,545,059 B2 | 6/2009 | Chen et al. |

(Continued)

FOREIGN PATENT DOCUMENTS

| | | |
|---|---|---|
| CN | 101142715 A | 3/2008 |
| CN | 103715211 A | 4/2014 |

(Continued)

OTHER PUBLICATIONS

*U.S. Appl. No. 16/287,796, filed Feb. 27, 2019, O'Sullivan et al.

(Continued)

*Primary Examiner* — William A Harriston
(74) *Attorney, Agent, or Firm* — Wolf, Greenfield & Sacks, P.C.

(57) ABSTRACT

Isolators having a back-to-back configuration for providing electrical isolation between two circuits are described, in which multiple isolators formed on a single monolithic substrate are connect in series to achieve a higher amount of electrical isolation for a single substrate than for one of the isolators alone. A pair of isolators in the back-to-back configuration have top and bottom isolator components where the top isolator components are connected together and electrically isolated from the underlying substrate, resulting in floating top isolator components. The back-to-back isolator may provide one or more communication channels for transfer of information and/or power between different circuits.

20 Claims, 8 Drawing Sheets

(56) References Cited

U.S. PATENT DOCUMENTS

| | | |
|---|---|---|
| 7,741,943 B2 | 6/2010 | Fouquet et al. |
| 7,856,219 B2 | 12/2010 | Dupuis |
| 7,902,627 B2 | 3/2011 | Dong et al. |
| 7,923,710 B2 | 4/2011 | Crawley et al. |
| 7,947,600 B2 | 5/2011 | Iwaya et al. |
| 8,061,017 B2 | 11/2011 | Fouquet et al. |
| 8,064,872 B2 | 11/2011 | Dupuis |
| 8,237,534 B2 | 8/2012 | Fouquet et al. |
| 8,446,243 B2 | 5/2013 | Strzalkowski et al. |
| 8,569,861 B2 | 10/2013 | O'Donnell et al. |
| 8,614,616 B2 | 12/2013 | Willkofer et al. |
| 8,643,138 B2 | 2/2014 | Dong |
| 8,742,539 B2 | 6/2014 | Weyers et al. |
| 9,105,391 B2 | 8/2015 | Fouquet et al. |
| 9,318,784 B2 | 4/2016 | Sin et al. |
| 9,380,705 B2 | 6/2016 | Chen |
| 9,496,926 B2 | 11/2016 | Bhamidipati et al. |
| 9,508,485 B1 | 11/2016 | Vinciarellu |
| 9,735,112 B2 | 8/2017 | Constantino et al. |
| 9,761,545 B2 | 9/2017 | Sin et al. |
| 9,812,389 B2 | 11/2017 | Ho et al. |
| 9,893,008 B2 | 2/2018 | Bonifield et al. |
| 9,929,038 B2 | 3/2018 | O'Sullivan |
| 10,074,939 B1 | 9/2018 | Briano |
| 10,121,847 B2 | 11/2018 | Cook et al. |
| 11,044,022 B2 | 6/2021 | O'Sullivan et al. |
| 2001/0000303 A1 | 4/2001 | Sasaki |
| 2003/0042571 A1 | 3/2003 | Chen et al. |
| 2004/0060164 A1 | 4/2004 | Wan et al. |
| 2004/0101226 A1 | 5/2004 | Zbinden |
| 2005/0024176 A1 | 2/2005 | Wang et al. |
| 2006/0226924 A1 | 10/2006 | Chen et al. |
| 2008/0080624 A1 | 4/2008 | Feldtkeller |
| 2008/0258561 A1 | 10/2008 | Mercer |
| 2008/0277761 A1 | 11/2008 | Mahalingam et al. |
| 2008/0311862 A1 | 12/2008 | Spina et al. |
| 2009/0230776 A1 | 9/2009 | Ochi et al. |
| 2010/0147215 A1 | 6/2010 | Baumann et al. |
| 2011/0095620 A1 | 4/2011 | Fouquet et al. |
| 2013/0027170 A1 | 1/2013 | Chen |
| 2013/0154071 A1 | 6/2013 | Haigh et al. |
| 2014/0145301 A1 | 5/2014 | Moghe et al. |
| 2014/0252533 A1 | 9/2014 | O'Sullivan |
| 2015/0069572 A1 | 3/2015 | Khanolkar et al. |
| 2015/0171934 A1 | 6/2015 | Brauchler et al. |
| 2015/0200162 A1* | 7/2015 | Constantino ...... H01L 23/49537 257/532 |
| 2015/0357113 A1 | 12/2015 | Scholz |
| 2016/0197059 A1 | 7/2016 | Lin et al. |
| 2017/0117084 A1 | 4/2017 | Murphy et al. |
| 2018/0130867 A1 | 5/2018 | Lambkin et al. |
| 2018/0226391 A1 | 8/2018 | Ueki |
| 2019/0109233 A1 | 4/2019 | Tellkamp et al. |
| 2019/0123040 A1 | 4/2019 | Fukahori |
| 2019/0206812 A1 | 7/2019 | Bonifield et al. |
| 2019/0222112 A1 | 7/2019 | Sakai |
| 2020/0076512 A1 | 3/2020 | O'Sullivan et al. |
| 2021/0065955 A1 | 3/2021 | Lambkin et al. |

FOREIGN PATENT DOCUMENTS

| | | |
|---|---|---|
| CN | 203554302 U | 4/2014 |
| CN | 104022113 A | 9/2014 |
| CN | 104838458 A | 8/2015 |
| CN | 106611741 A | 5/2017 |
| CN | 206602009 U | 10/2017 |
| CN | 107919868 A | 4/2018 |
| EP | 1 990 914 A2 | 11/2008 |
| EP | 2 958 144 A1 | 12/2015 |
| EP | 3 159 946 A1 | 4/2017 |
| JP | 2004-229406 A | 8/2004 |
| TW | 200614290 A | 5/2006 |
| TW | 201442146 A | 11/2014 |
| TW | 201608902 A | 3/2016 |
| TW | 201639426 A | 11/2016 |
| TW | 201727870 A | 8/2017 |

OTHER PUBLICATIONS

*U.S. Appl. No. 16/553,954, filed Aug. 28, 2019, Lambkin et al.
PCT/IB2017/001472, dated Feb. 14, 2018, International Search Report and Written Ooinion.
International Search Report and Written Opinion dated Feb. 14, 2018 in connection with International Application No. PCT/IB2017/001472.
Chen, Isolation in Digital Power Supplies Using Micro-Transformers. IEEE. 2009; 2039-2042.
Chen, Fully Integrated Isolated DC-DC Converter Using Micro-Transformers. IEEE. 2008; 335-338.
Krakauer, Balancing the Major Elements of an Isolator for Safety's Sake. Analog Devices. Technical Article MS-2576. 2014; 4 pages.
Lumio, Applicability of CMOS Digital Isolators in Variable-Frequency Drives. Thesis submitted for Master of Science in Technology. Aalto University School of Electrical Engineering. Jan. 1, 2016. 80 pages.
Extended European Search Report dated May 10, 2021 in connection with European Application No. 20209202.9.

* cited by examiner

MONOLITHIC BACK-TO-BACK ISOLATION ELEMENTS WITH FLOATING TOP PLATE

FIELD OF THE DISCLOSURE

The present application relates to galvanic isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits are referenced to different electrical ground potentials. Isolators can be used to electrically isolate circuits in either of these situations. Connecting multiple isolators in series may increase the amount of isolation between the circuits.

BRIEF SUMMARY

Isolators having a back-to-back configuration for providing electrical isolation between two circuits are described, in which multiple isolators formed on a single, monolithic substrate are connected in series to achieve a higher amount of electrical isolation for a single substrate than for a single isolator formed on substrate. Connecting the top isolator components, which are distal from the single substrate, may provide electrical isolation to the top isolator components. The back-to-back isolator may provide one or more communication channels for transfer of information and/or power between the circuits connected to the bottom isolator components.

In some embodiments, an integrated isolator device is provided. The integrated isolator device comprises a substrate, and a first isolator component and a second isolator component positioned over the substrate. The integrated isolator device further comprises a third isolator component positioned over the first isolator component and a fourth isolator component positioned over the second isolator component. The integrated isolator device further comprises at least one conductor connecting the third isolator component to the fourth isolator component.

In some embodiments, an integrated isolator device is provided. The integrated isolator device comprises a substrate, and a first isolator component and a second isolator component positioned over the substrate. The integrated isolator device further comprises at least one third isolator component configured to electromagnetically couple with the first isolator component and the second isolator component. The first isolator component and the second isolator component are positioned between the at least one third isolator component and the substrate. The integrated isolator device further comprises a first electrical contact coupled to the first isolator component and a second electrical contact coupled to the second isolator component.

In some embodiments, a system comprising an isolator, at least one first circuit, and at least one second circuit is provided. The isolator comprises a substrate, and a first isolator component and a second isolator component positioned over the substrate. The isolator further comprises at least one third isolator component positioned over the first isolator component and the second isolator component. The at least one first circuit is coupled to the first isolator component and configured to operate in a first voltage domain. The at least one second circuit coupled to the second isolator component and configured to operate in a second voltage domain different than the first voltage domain.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
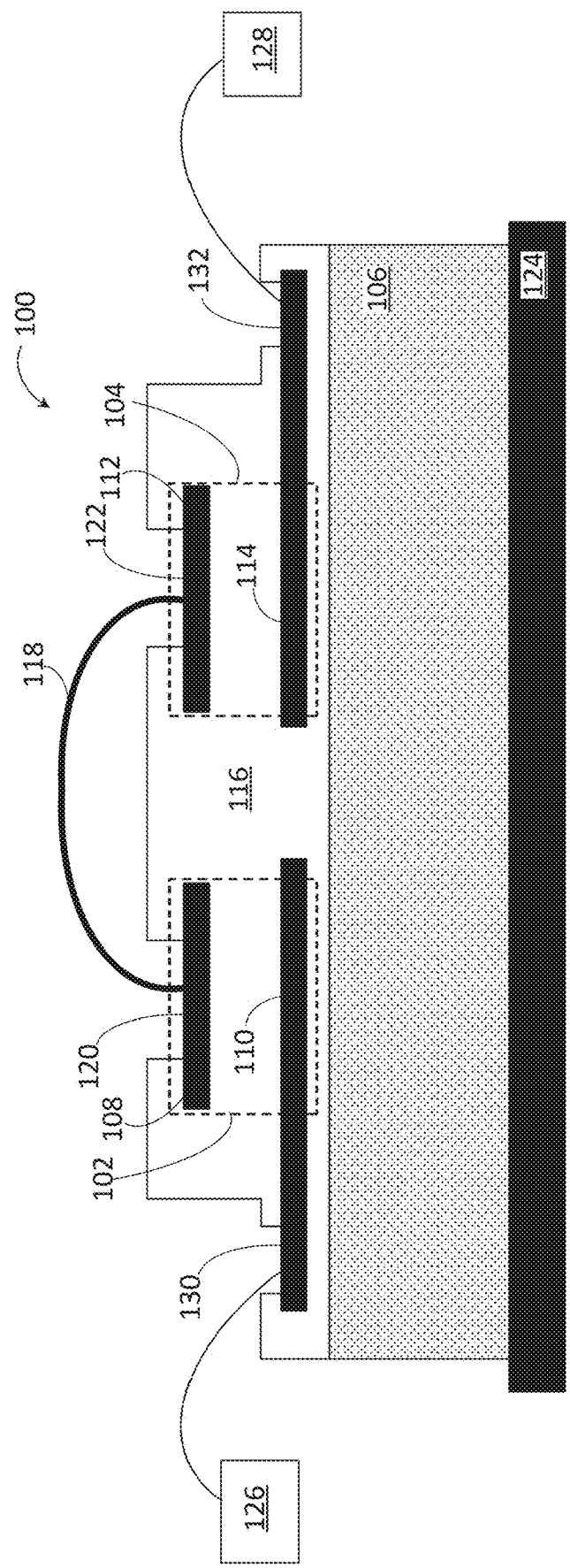
FIG. 1A is a cross-sectional view of an integrated isolator device having a back-to-back configuration.

Aspects of the present application relate to a back-to-back isolator formed on a single monolithic integrated device. The back-to-back isolator includes two or more isolators connected in series formed on a single substrate (e.g., glass substrate, ceramic substrate, semiconductor substrate). One approach for achieving a back-to-back configuration is to connect two isolators on separate substrates in series to achieve an effective isolation equaling the cumulative isolation properties of the two isolators. In contrast, aspects of the present application provide back-to-back isolators formed on a single substrate. A benefit of a monolithic configuration is that the total isolation may be the cumulative isolation properties of two isolators, with less overall footprint (substrate area) because the structure has substantially similar area as a single isolator (e.g., approximately 10%-15% larger than a single isolator). For example, if each isolator in the back-to-back configuration can withstand 600 V, then the cumulative isolation the back-to-back isolator can handle is approximately 1200 V. Additionally, forming the back-to-back isolator on a single substrate reduces costs in comparison to a multi-substrate back-to-back configuration because less substrate area is used. The higher isolation provided by the back-to-back isolator on a single substrate can be implemented in high voltage applications, such as industrial (e.g., machine monitoring) and healthcare or medical applications, which typically require high isolation voltages—for example, the ability to protect against surge events (e.g., 15 kV-20 kV)—that can be challenging to achieve with single isolators. More generally, it may be desirable to isolate voltages from approximately 400V up to approximately 20 kV, whether in steady state operation or as surge events.

In particular, aspects of the present application relate to a back-to-back isolator structure that includes a first pair of isolator components (e.g., coils or windings, or capacitive plates) forming one of the isolators and a second pair of isolator components forming the other isolator. The isolator components in each pair are arranged vertically within the integrated device, forming a top isolator component and a bottom isolator component at different vertical levels separated by dielectric material. The top isolator components are electrically shorted together and are electrically isolated from the underlying substrate and the bottom isolator components, forming floating top isolator components in the integrated device. The bottom isolator components are configured to act as inputs and outputs for the back-to-back isolator. For example, a bottom isolator component of the first pair may electrically connect to a transmitter while a bottom isolator component of the second pair may electrically connect to a receiver.

To achieve a desired performance in a back-to-back isolator, including a desired voltage capability, the capacitance between the isolator components of a pair (e.g., the top isolator component and bottom isolator component) is high to allow for electric field coupling or magnetic field coupling. However, parasitic capacitance may exist between the floating isolator components and an underlying conductor. For example, in some embodiments, the isolator may be disposed on a paddle portion of a lead frame as part of packaging for the isolator. A parasitic capacitance may exist between the floating isolator components and the paddle portion. The parasitic capacitance between the floating isolator components and an underlying conductor may reduce the voltage capabilities that the isolator may otherwise be configured to achieve. For example, the parasitic capacitance may result in a voltage imbalance between the two isolators in the back-to-back configuration and, during operation, the resulting isolator may be limited by the device connected to the isolator having the higher portion of the voltage.

The back-to-back configuration described in the present application, having floating top isolator components, may provide the benefit of reducing or eliminating parasitic capacitance between the top isolator components and an underlying conductor, such as the underlying substrate (e.g., silicon substrate) and/or a paddle portion of the lead frame that the isolator is positioned on as part of packaging for the isolator. In contrast to floating the bottom isolator components, floating the top isolator components increases the thickness of the dielectric material between the floating isolator components and the underlying conductor, which may reduce or eliminate the parasitic capacitance. The back-to-back isolator may be formed on a microfabricated substrate (e.g., glass substrate, silicon substrate) having a substantial thickness of dielectric material (e.g., >400 µm for glass) such that when the isolator is packaged by positioning the substrate on a lead frame, the resulting packaged isolator has a substantially low parasitic capacitance between the top isolator components and the underlying paddle portion of the lead frame to reduce the impact of the parasitic capacitance on the performance capabilities of the isolator. In some embodiments, the back-to-back isolator may be formed, using suitable microfabrication techniques, on a dielectric substrate (e.g., glass substrate), and the dielectric substrate may contact the paddle portion of the lead frame in the packaged isolator. In some embodiments, the back-to-back isolator may be formed on an insulating layer (e.g., polyimide layer), which is over a silicon substrate (e.g., silicon die or chip), and the silicon substrate may contact the paddle portion in the packaged isolator. In such embodiments, the thickness of the insulating layer may act to reduce the parasitic capacitance between the top isolator components and the silicon substrate, which may have a conductive contact with the underlying paddle portion.

In addition, the lateral area of the top isolator components relative to their respective bottom isolator components may further impact performance of the back-to-back isolator. In some embodiments, the isolator may have top isolator components that have a smaller lateral area in comparison to their respective bottom isolator components. For example, a top isolator component may have a lateral area that is in the range of 75%-95% of their respective bottom isolator component. Such a configuration may further reduce or eliminate any parasitic capacitance between the top isolator components and an underlying conductor in the resulting packaged isolator because the bottom isolator components may act to shield the top isolator components from the underlying conductor. In some embodiments, the top isolator components may be connected in a manner that reduces or eliminates parasitic capacitance, such as by connecting the top isolator components with an external bond wire or with a conductor integrated in the isolator. The integrated conductor connecting the top isolator components may have one or more dimensions smaller than a lateral dimension of one or both of the top isolator components. For example, the integrated conductor may have a width of approximately 5% the width of one or both of the top isolator components. In some embodiments, the integrated conductor may be formed in the same layer of the top isolator components as a conductive region connecting the top isolator components. In some embodiments, the integrated conductor may be formed of a wire bond integrated in the isolator as one or more metal layers formed over the top isolator components.

Some aspects of the present application relate to structural features that may allow for further desired performance of the back-to-back isolator by reducing or eliminating electric field interference in regions where there is vertical overlap between a connection to a top or bottom isolator component and the other isolator component in the pair. For example, a conductor connecting a contact pad to a bottom isolator component may vertically overlap with its respective top isolator component, and the region of overlap may reduce performance of the isolator because of electrical interference occurring at this region. The impact of such electric field interference regions may be reduced or eliminated by reducing the amount of vertical overlap between conductor(s) connecting to the top and bottom isolator components and their respective isolator component in the isolator pair. For example, connecting the top isolator components using an external bond wire and having a smaller lateral area for the top isolator components in comparison to the bottom isolator components may substantially reduce or completely eliminate electric field interference regions that may otherwise contribute to reduced performance.

The back-to-back isolator configurations described herein may be applied to various types of isolator technology, including inductive coupling isolators and capacitive coupling isolators, by forming different types of isolator components on the substrate. In embodiments where the isolator components are coils or windings, the back-to-back isolator includes two transformers connected in series. In embodiments where the isolator components are capacitive plates, the back-to-back isolator includes two capacitive isolators connected in series. Some embodiments may provide increased working voltage, withstand or isolation rating, and surge robustness performance compared to alternative constructions. The back-to-back configuration may facilitate simplicity of design and deliver cost savings over separate die construction. The back-to-back isolator of the present application floats the top isolator components, while the bottom isolator components are connected to circuitry coupled to respective isolated potentials. With this approach, both pairs of isolator components can coexist on a single substrate where the top isolator components are maintained in a floating state. In embodiments where the substrate is a semiconductor substrate, the top isolator components may connect to a floating paddle within the package. In embodiments where the substrate is a glass substrate, a floating paddle may not be necessary to achieve a floating state for the top isolator components, such as by connecting to a floating paddle within the package.

The aspects and embodiments described above, as well as additional aspects and embodiments, are described further below. These aspects and/or embodiments may be used individually, all together, or in any combination of two or more, as the application is not limited in this respect.

Aspects of the present application relate to structures of a single monolithic back-to-back isolator that facilitates a desired isolation performance, including by reducing or eliminating parasitic capacitance between the isolators on the device with an underlying conductor, such as a paddle portion of a lead frame in the packaged version of the device. According to some embodiments, reduced parasitic capacitance can be achieved by connecting the top isolator components such that the two isolators are connected in series and have a back-to-back configuration, and using the bottom isolator components as inputs and outputs. FIG. 1A is a cross-sectional view of an integrated isolator device having a back-to-back configuration. Integrated isolator device 100 includes two isolators, 102 and 104, connected in series positioned over the same substrate 106. Each of isolators 102 and 104 has a pair of isolator components (e.g., coils or windings, capacitive plates). In each isolator, the isolator components are electromagnetically coupled, which may arise from the relative proximity of the isolator components to each other. Isolator 102 includes isolator component 108 and isolator component 110, which are positioned to electromagnetically couple with each other. Isolator 104 includes isolator component 112 and isolator component 114, which are positioned to electromagnetically couple with each other. As shown in FIG. 1A, both isolator components 110 and 112 are positioned over substrate 106, isolator component 108 is positioned over isolator component 110, and isolator component 112 is positioned over isolator component 114. In some embodiments, isolators 102 and 104 are two capacitive coupling isolators where isolator components 108, 110, 112, 114 are capacitive plates. In other embodiments, isolators 102 and 104 are two transformers where isolator components 108, 110, 112, 114 are coils.

As shown in FIG. 1A, isolator components 108 and 110 are positioned in separate vertical layers of integrated isolator device 100 and to overlap, at least partially, with each other. Similarly, isolator components 112 and 114 are positioned in separate vertical layers of integrated isolator device 100 and to overlap, at least partially, with each other. Isolator components 108 and 112 are positioned distal from substrate 106 and may be considered as "top" isolator components, while isolator components 110 and 114 are positioned proximate to substrate 106 and may be considered as "bottom" isolator components. In some embodiments, bottom isolator components 110 and 114 are formed in the same plane of the integrated isolator device. In some embodiments, top isolator components 108 and 112 are formed in the same plane of the integrated isolator device.

According to some aspects of the back-to-back configurations described herein, isolators are connected in series by connecting the top isolator components to each other. As shown in FIG. 1A, isolators 102 and 104 are connected in series by coupling top isolator component 108 to top isolator component 112 through one or more conductors. In particular, wire bond 118 connects top isolator components 108 and 112 through contact 120 for top isolator component 108 and contact 122 for top isolator component 112. Top isolator components 108 and 112 may lack connections to external circuitry or ground potential, such that top isolator components 108 and 112 are considered to be floating. Bottom isolator components 110 and 114 are electrically isolated from one another, and in some embodiments, configured to operate at different voltages. For example, bottom isolator component 110 may be configured to operate at a first voltage, and bottom isolator component 114 may be configured to operate at a second voltage different than the first voltage.

Substrate 106 may include one or more dielectric materials (e.g., glass, polyimide). As shown in FIG. 1A, substrate 106 is positioned on paddle 124, which may be a portion of a lead frame for the packaged isolator. In some embodiments, substrate 106 may include a silicon die and an insulating layer formed over the silicon die, separating isolators 102 and 104 from the silicon die. According to the isolator configurations described herein, substrate 106 may be considered as a microfabricated die or microfabricated chip because both isolators 102 and 104 are formed on substrate 106. For example, microfabrication techniques may be implemented in fabricating the isolator by forming an array of the back-to-back isolators on a wafer, which is then subsequently diced to form individual die having both isolators 102 and 104. As part of packaging the isolator device, the die may then be positioned on paddle region 124 of a lead frame.

Integrated isolator device 100 includes dielectric material 116 between isolators 102 and 104, as well as between top isolator component 108 and bottom isolator component 110, and between top isolator component 112 and bottom isolator component 114. Although FIG. 1A shows dielectric material 116 positioned between bottom isolator components 110, 114 and substrate 106, some embodiments may have bottom isolator components positioned in contact with substrate 106. Dielectric material 116 may be formed at least partially over top isolator components 108 and 112. In some embodiments, dielectric material 116 may be formed of multiple layers of one or more dielectric materials.

Integrated isolator device 100 includes electrical contacts 130 and 132 coupled to bottom isolator components 110 and 114, respectively, which allow bottom isolator components 110 and 114 to connect to circuit(s) external to substrate 106. As shown in FIG. 1A, bottom isolator component 110 is connected to circuit 126 and bottom isolator component 114 is connected to circuit 128, such as by using bond wire(s). Circuits 126 and 128 may act as input and output circuitry for integrated isolator device 100. In some embodiments, circuit 126 may include a transmitter and circuit 128 may include a receiver such that power and/or data is transferred from circuit 126 to circuit 128 through the back-to-back isolators by transferring from bottom isolator component 110 to top isolator component 108 in isolator 102 and then from top isolator component 112 to bottom isolator component 114 in isolator 104. In some embodiments, integrated isolator device 100 may have a configuration allowing for transfer of signals and/or power in reverse through the isolator components. In such embodiments, circuit 128 may include a transmitter and circuit 126 may include a receiver, and power and/or data is transferred from bottom isolator component 114 to top isolator component 112 in isolator 104 and then from top isolator component 108 to bottom isolator component 110 in isolator 102. In this manner, integrated isolator device 100 may allow for bi-directional transfer of signals and/or power.

Circuit 126 and circuit 128 may be configured to operate at different voltages or be referenced to different ground potentials, and integrated isolator device 100 may allow for circuits 126 and 128 to exchange data. Integrated isolator device 100 may be applied in a variety of applications (e.g., industrial, medical, consumer) where isolators may be used, including isolated control switches and isolated power supply controllers. As an example, a piece of industrial machinery may operate at a high voltage and be controlled by a computer of other control equipment that operates at a much lower voltage, with the two communicating via a back-to-back isolator of the type illustrated in FIG. 1A. Circuits 126 and 128 may electrically couple with two different power supplies and/or circuits 126 and 128 may have separate ground references. In this manner, the bottom isolator components of integrated isolator device 100 may operate in different voltage domains, where bottom isolator component 110 is configured to operate in one voltage domain and bottom isolator component 114 is configured to operate in a different voltage domain.

According to aspects of the present application, integrated isolator device 100 may provide improved performance, particularly because of the reduced parasitic capacitance between one or both of top isolator components 108 and 112 and paddle portion 124. In particular, a capacitance between either or both top isolator components 108 and 112 and paddle portion 124 is less than a capacitance between a pair of isolator components in either or both isolators 102 and 104, such as between top isolator component 108 and bottom isolator component 110. This lower capacitance may be in part due to the thickness of substrate 106 and/or the relative lateral areas of top isolator components 108, 112 to their respective bottom isolator components 110, 114. In some embodiments, one or more dielectric materials of substrate 106 may have a greater thickness than a region of dielectric material positioned between a pair of top and bottom isolator components, such as dielectric material 116 positioned between top isolator component 108 and bottom isolator component 110. In embodiments where substrate 106 is one or more dielectric materials (e.g., glass), the thickness of substrate 106 may be in the range of 100 µm to 600 µm, or any value or range of values in that range. In contrast, a thickness of dielectric material positioned between a top isolator component and its respective bottom isolator component may be in the range of 10 µm to 50 µm, or any value or range of values in that range.

According to aspects of the present application, the top and bottom isolator components, and conductor(s) connected to the isolator components may have varying relative lateral areas to achieve desired performance, such as by reducing electric field interference and/or voltage imbalance during operation. In particular, electric field interference may occur from overlapping edges of conductive layers within the isolator device. Such electric field interference may be reduced or eliminated by having different lateral areas for top and bottom isolator components in an isolator because doing so reduces the amount of vertical overlapping edges for the top and bottom isolator components. Accordingly, some embodiments may include a top isolator component with a smaller lateral area than its respective bottom isolator component within an isolator. The top isolator component may be positioned to be, at least partially, within a periphery of the underlying bottom isolator component. For example, a top isolator component may have a lateral area that is in the range of 75%-95% of its respective bottom isolator component. In some embodiments, the isolator device may have a bottom isolator component with a smaller lateral area than its respective top isolator component. Similarly, the bottom isolator component may be positioned to be, at least partially, within a periphery of the overlying top isolator component. For example, a bottom isolator component may have a lateral area that is in the range of 75%-95% of its respective top isolator component. In addition, conductive regions integrated as part of the isolator device may be suitably sized and shaped to reduce electric field interference during operation. In some embodiments, a conductive region connecting an electrical contact to a bottom isolator component may overlap with the respective top isolator component, and the conductive region may have one or more suitable dimensions to reduce electric field interference between the conductive region and the top isolator component. Although the above discussion is in the context of an isolator having different lateral areas for its top isolator component and its bottom isolator component, it should be appreciate that some embodiments may involve having one or both isolators in the back-to-back configuration where the top and bottom isolator components have substantially the same lateral area.

Figure 1B:
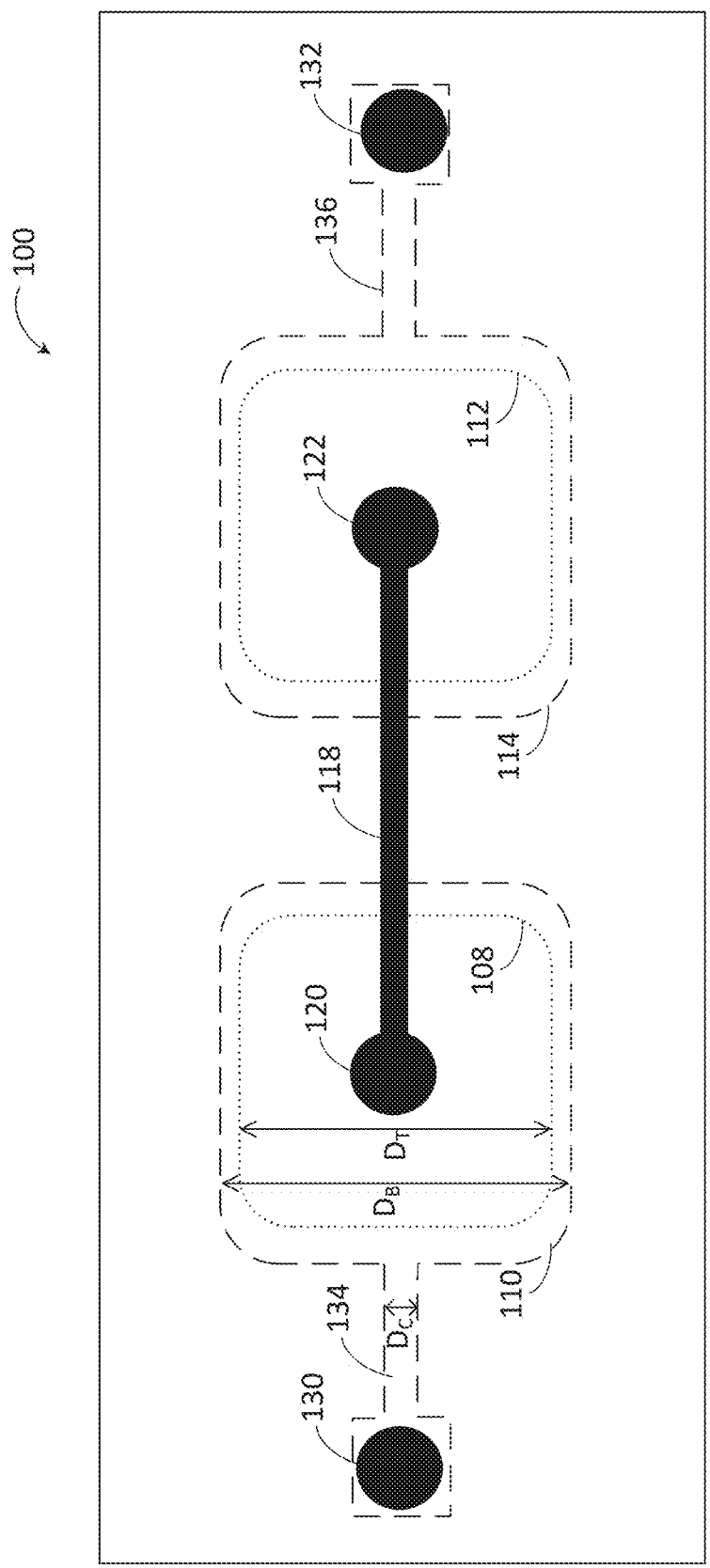
FIG. 1B is a top view of the integrated isolator device shown in FIG. 1A.

FIG. 1B is a top view of integrated isolator device 100 shown in FIG. 1A. Top views of top isolator components 108, 112 are shown by dotted outlines in FIG. 1B. Bottom isolator components 110, 114 and conductive regions 134, 136 connecting bottom isolator components 110, 114 to electrical contacts 130, 132, respectively, are shown by dashed outlines in FIG. 1B. In particular, conductive region 134 connects electrical contact 130 to bottom isolator component 110, and conductive region 136 connects electrical contact 132 to bottom isolator component 114. Conductive region 134 and bottom isolator component 110 may be formed in the same layer of integrated isolator device 100, and in some embodiments, of the same conductive material(s). Similarly, conductive region 136 and bottom isolator component 114 may be formed in the same layer of integrated isolator device 100, and in some embodiments, of the same conductive material(s).

As shown in FIG. 1B, top isolator components 108, 112 may have smaller lateral areas than their respective bottom isolator components 110, 114. In particular, top isolator components 108, 112 may have one or more lateral dimensions, such as dimension $D_T$ of top isolator component 108, which is smaller than one or more lateral dimensions of bottom isolator components 110, 114, such as dimension $D_B$ of bottom isolator component 110. As a non-limiting example, $D_B$ may be approximately 300 µm and $D_T$ may be approximately 260 µm. In some embodiments, a periphery of a top isolator component may be at least partially within a periphery of its respective bottom isolator component in one or both of the isolators in the back-to-back isolator. For example, the periphery of top isolator 112, shown by the dotted lines, is within the periphery of bottom isolator component 114, shown by the dashed lines. Conductive regions 134, 136 may have a lateral dimension, such as dimension Dc of conductive region 134. The lateral dimension of conductive regions 134, 136 may be smaller than a lateral dimension of bottom isolator components 110, 114.

In addition, voltage imbalance during operation of a back-to-back isolator may occur between the two isolators connected in series where the two isolators in series do not experience a substantially similar amount of voltage even if the isolators have similar configurations. Voltage imbalance across the two isolators may negatively impact the performance of the back-to-back isolator. To account for such voltage imbalance, the two isolators may have varying lateral areas such that the isolator components of one isolator have different lateral areas in comparison to its corresponding isolator component in the other isolator. In some embodiments, an area of overlap between a top isolator component and its respective bottom isolator component may be different for the two isolators. For example, top isolator component 108 may have a larger lateral area (e.g., dimension $D_T$) than top isolator component 112, and bottom isolator component 110 may have a larger lateral area (e.g., dimension $D_B$) than bottom isolator component 114. In some embodiments, one or both isolator components of one isolator may have a dimension relative to one or both isolator components of the other isolator in the range of 70% to 99%, or any value or range of values in that range. In such instances, the relative lateral areas may accommodate any voltage imbalance between isolators 102 and 104 that would otherwise occur during operation.

Figure 2A:
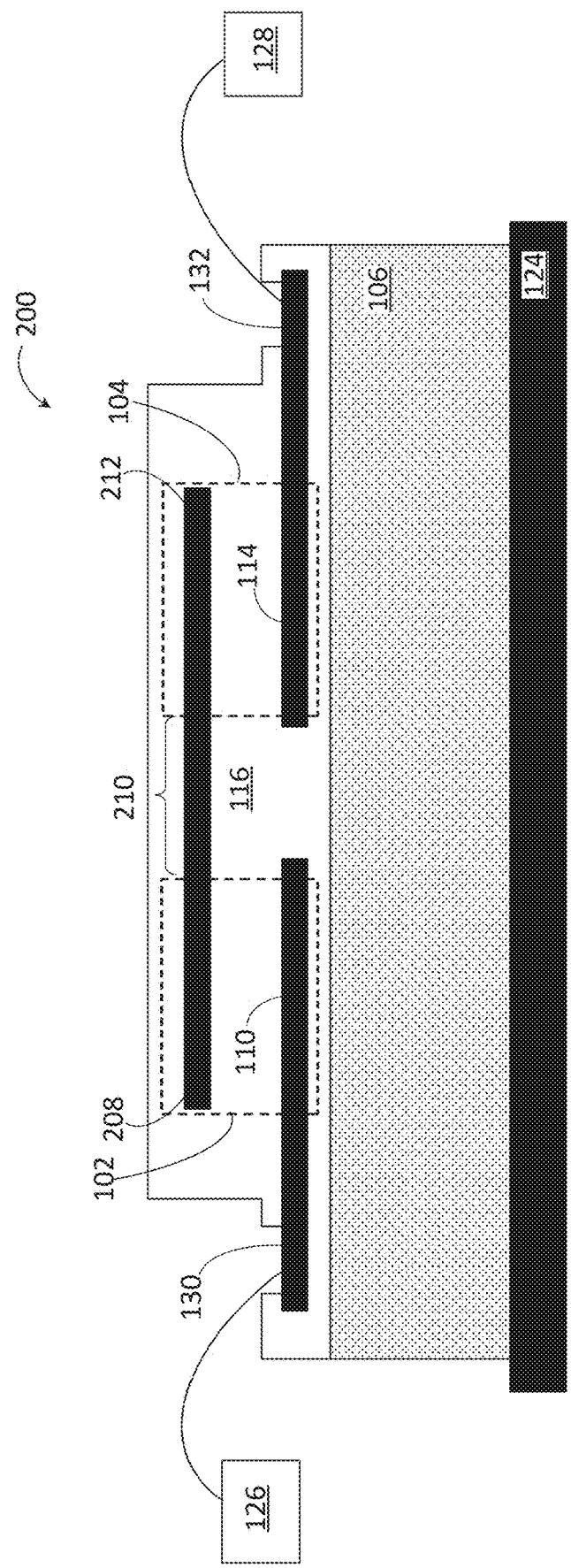
FIG. 2A is a cross-sectional view of an integrated isolator device having a back-to-back configuration.

FIG. 2A is a cross-sectional view of an integrated isolator device having a back-to-back configuration. Integrated isolator device 200 includes isolator 102 having isolator components 110, 208 positioned to electromagnetically couple with one another, and isolator 104 having isolator components 114, 212 positioned to electromagnetically couple with one another. Similar to the integrated isolator device shown in FIG. 1A, top isolator components 208, 212 and bottom isolator components 110, 114 are positioned in separate vertical layers of integrated isolator device 200. In some embodiments, top isolator components 208 and 212 are formed in the same plane of the integrated isolator device.

In contrast to integrated isolator device 100 that has wire bond 118 connecting top isolator components 208, 212, integrated isolator device 200 has an integrated conductor connecting top isolator components. In particular, as shown in FIG. 2A, conductive region 210 connects top isolator components 208 and 212 to each other. In some embodiments, conductive region 210 and top isolator components 208, 212 may be formed of the same conductive material(s) and/or in the same layer of the integrated isolator device. In such embodiments, conductive region 210 and top isolator components 208, 212 may be considered as a single isolator component that has one conductive region positioned to electromagnetically couple with bottom isolator component 110, another conductive region positioned to electromagnetically couple with bottom isolator component 114, and a third conductive region connecting the two conductive regions.

Figure 2B:
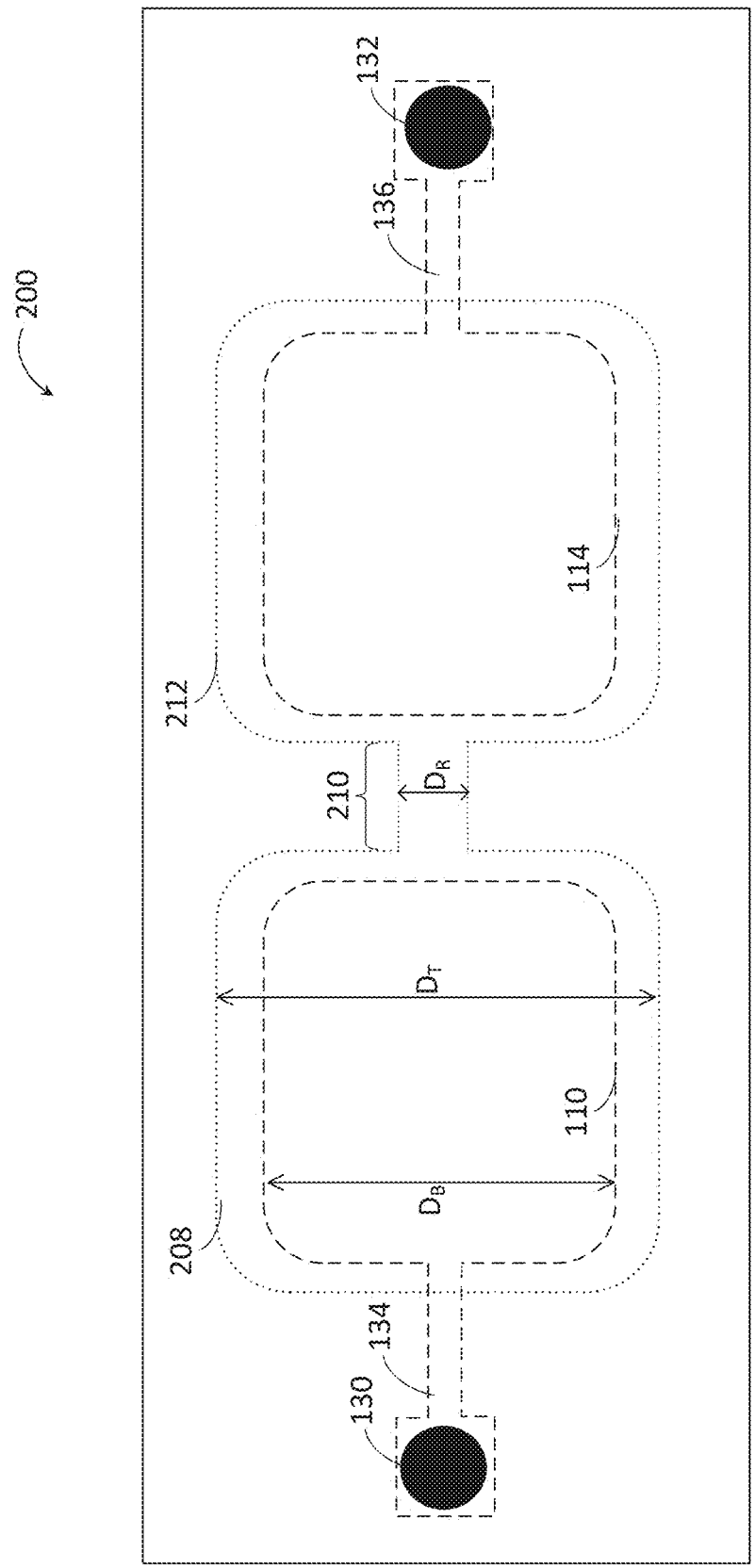
FIG. 2B is an exemplary top view of the integrated isolator device shown in FIG. 2A.

FIG. 2B is an exemplary top view of integrated isolator device 200 shown in FIG. 2A. Bottom isolator components 110, 112 and conductive regions 134, 136 connecting bottom isolator components 110, 112 to electrical contacts 130, 132, respectively, are shown by dashed outlines in FIG. 2B. Top views of top isolator components 208, 212 and conductive region 210 connecting isolator components 208 and 212 are shown by dotted outlines in FIG. 2B.

As shown in FIG. 2B, top isolator components 208, 212 may have greater lateral areas than their respective bottom isolator components 110, 114. In particular, top isolator components 208, 212 may have one or more lateral dimensions, such as dimension $D_T$ of top isolator component 208, which is greater than one or more lateral dimensions of bottom isolator components, 110, 114, such as dimension $D_B$ of bottom isolator component 110. In some embodiments, a periphery of a bottom isolator component may be at least partially within a periphery of its respective top isolator component in one or both of the isolators in the back-to-back isolator. For example, the periphery of bottom isolator 114, shown by the dashed lines, is within the periphery of top isolator component 212, shown by the dotted lines. Conductive region 210 may have a lateral dimension, such as dimension $D_R$ of conductive region 210, that is smaller than a lateral dimension of top isolator components 208, 212, such as dimension $D_T$ of top isolator component 208. Reducing the area of conductive region 210 may reduce the effects of parasitic capacitance between conductive region 210 and an underlying conductor, such as paddle 124. Dimension $D_T$ of top isolator component 208 relative to dimension $D_B$ of bottom isolator component 110 may be in the range of 75%-95%, or any value or range of values in that range. Dimension $D_R$ of conductive region 210 relative to dimension $D_T$ of top isolator component 208 may be in the range of 1%-20%, or any value or range of values in that range. In some embodiments, dimension $D_R$ of conductive region 210 may be approximately 5% of dimension $D_T$.

Figure 2C:
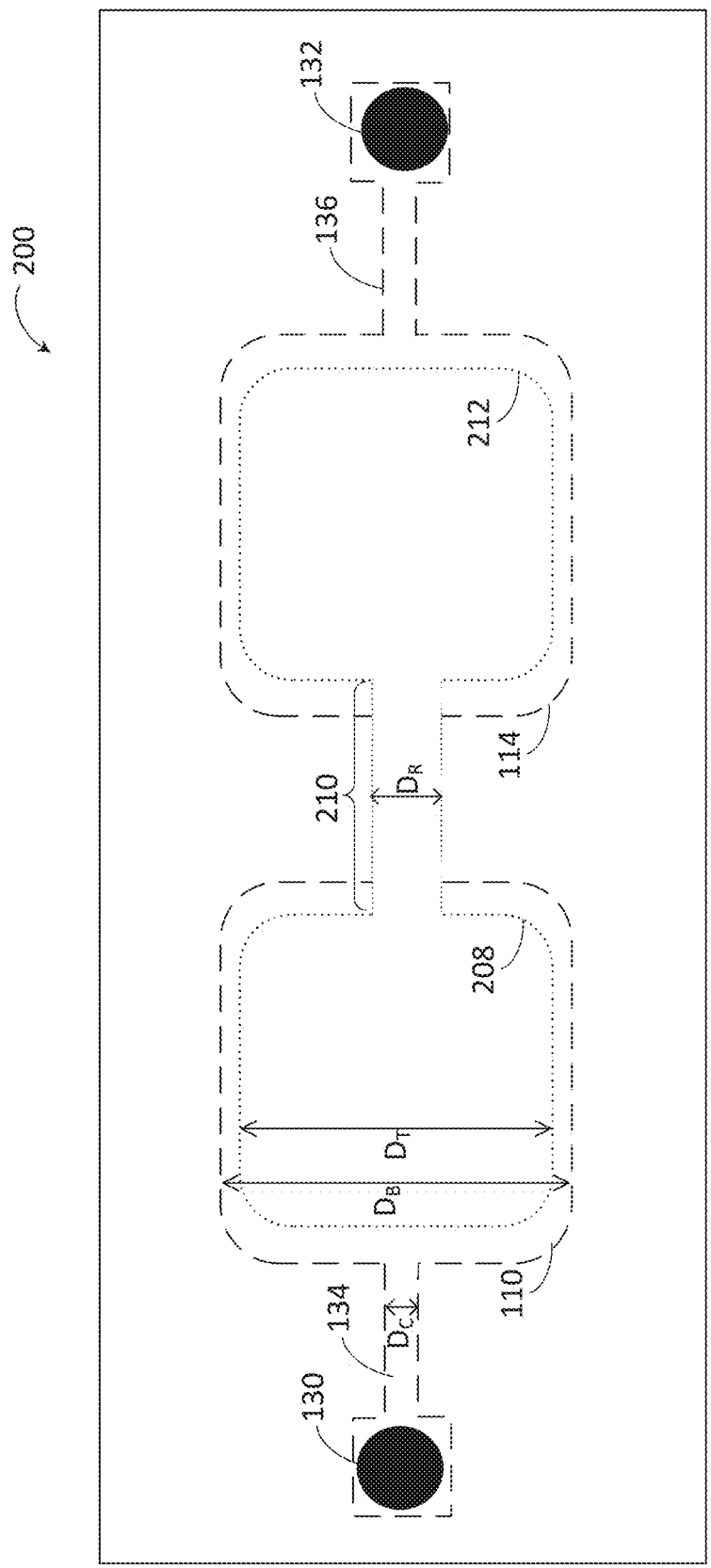
FIG. 2C is an exemplary top view of the integrated isolator device shown in FIG. 2A.

In some embodiments of integrated isolator device 200 shown in FIG. 2A, the top isolator components may have smaller lateral areas than their respective bottom isolator components. FIG. 2C is an exemplary top view of integrated isolator device 200 shown in FIG. 2A having top isolator components with smaller lateral areas in comparison to their respective bottom isolator components. As with FIG. 2B, bottom isolator components 110, 112 and conductive regions 134, 136 connecting bottom isolator components 110, 112 to electrical contacts 130, 132, respectively, are shown by dashed outlines in FIG. 2C. Top views of top isolator components 208, 212 and conductive region 210 connecting isolator components 208 and 212 are shown by dotted outlines in FIG. 2C.

As shown in FIG. 2C, top isolator components 208, 212 may have smaller lateral areas than their respective bottom isolator components 110, 114. In particular, top isolator components 208, 212 may have one or more lateral dimensions, such as dimension $D_T$ of top isolator component 208, which is smaller than one or more lateral dimensions of bottom isolator components, 110, 114, such as dimension $D_B$ of bottom isolator component 110. In some embodiments, a periphery of a top isolator component may be at least partially within a periphery of its respective bottom isolator component in one or both of the isolators in the back-to-back isolator. For example, the periphery of top isolator 212, shown by the dotted lines, is within the periphery of bottom isolator component 114, shown by the dashed lines. Conductive region 210 may have a lateral dimension, such as dimension $D_R$ of conductive region 210, that is smaller than a lateral dimension of top isolator components 208, 212, such as dimension $D_T$ of top isolator component 208. Reducing the area of conductive region 210 may reduce the effects of parasitic capacitance between conductive region 210 and an underlying conductor, such as paddle 124.

Figure 3:
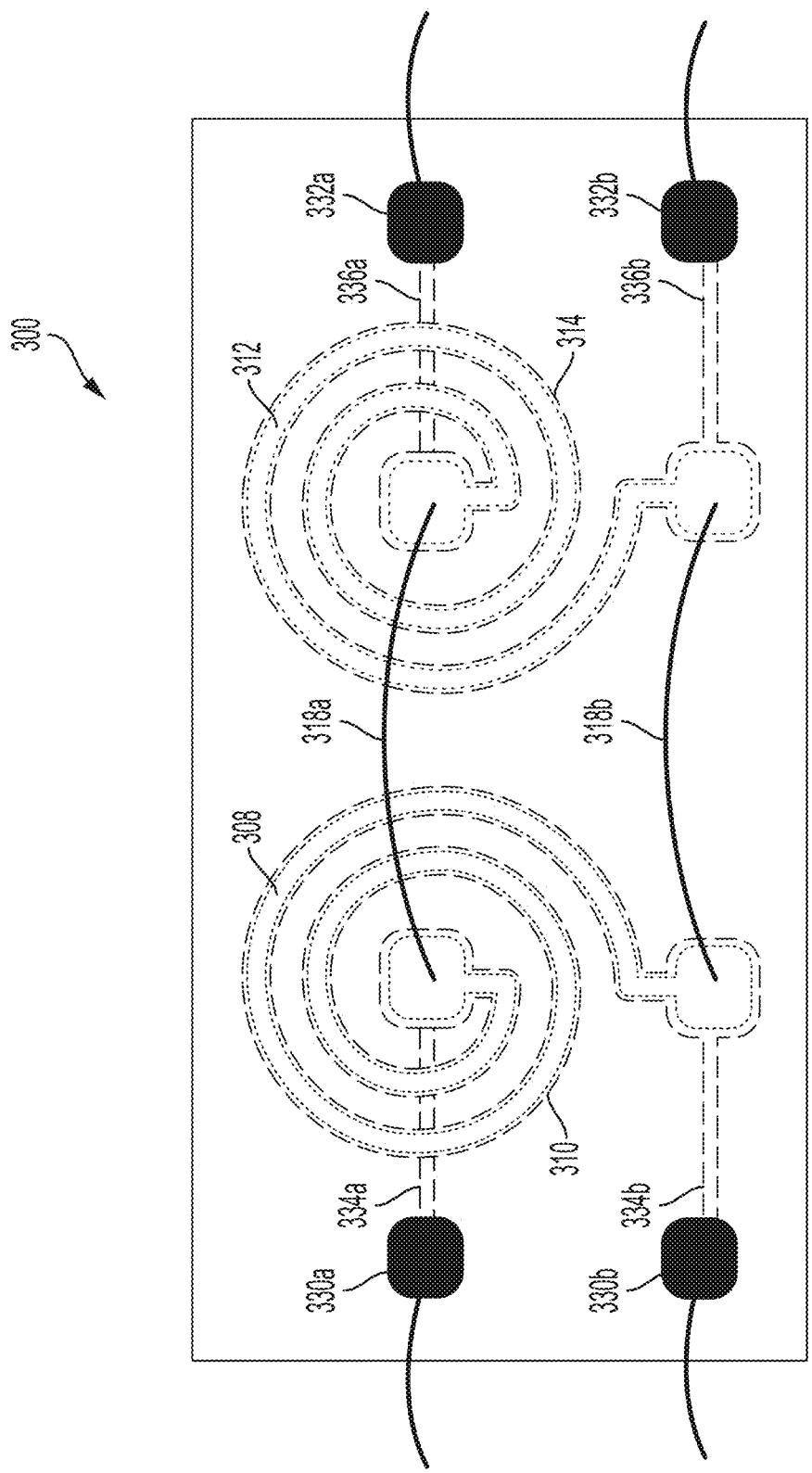
FIG. 3 is a top view of an integrated isolator device having two transformers connected in series.

In some embodiments, the isolators connected in series are transformers where the top coils or windings are connected together. FIG. 3 is a top view of a back-to-back isolator having two transformers connected in series. Integrated isolator device 300 may have a similar structure as integrated isolator device 100, except that the isolators are transformers and the isolator components are coils or windings. One transformer includes top coil 308 and bottom coil 310. The other transformer includes top coil 312 and bottom coil 314. As shown in FIG. 3, top coils 308 and 312 may be positioned within the periphery of bottom coils 310 and 314, respectively. Connecting top coils 308 and 312 in series may involve connecting the inner terminal of top coil 308 to the inner terminal of top coil 312 and connecting the outer terminal of top coil 308 to the outer terminal of top coil 312. As shown in FIG. 3, some embodiments involve using wire bonds to connect the terminals of the top coils. In particular, wire bond 318a connects the inner terminal of top coil 308 to the inner terminal of top coil 312, and wire bond 318b connects the outer terminal of top coil 308 to the outer terminal of top coil 312. The bottom coils 310 and 314 connect with circuits, such as input and output circuits. Conductive traces connecting from the terminals of bottom coils 310 and 314 to electrical contacts may facilitate connecting bottom coils 310 and 314 to circuits. As shown in FIG. 3, conductive trace 334a connects the inner terminal of bottom coil 310 to electrical contact 330a, conductive trace 334b connects the outer terminal of bottom coil 310 to electrical contact 330b, conductive trace 336a connects the inner terminal of bottom coil 314 to electrical contact 332a, and conductive trace 336b connects the outer terminal of bottom coil 314 to electrical contact 332b. Electrical contacts 330a, 330b may connect to one circuit (e.g., transmitter, receiver), and electrical contacts 332a, 332b may connect to another circuit.

One or more conductive traces may be positioned in a layer (e.g., metal layer) of the isolator vertically separated from one or more of the coils. As an example, conductive trace 336a may be positioned in a layer of isolator 300 vertically separated from both top coil 312 and bottom coil 314. In some embodiments, conductive trace 336a may be positioned in a layer of isolator 300 below bottom coil 314 such that bottom coil 314 is in a layer between the layer having conductive trace 336a and a layer having top coil 312. Such a configuration may allow for conductive trace 336a to form an electrical connection between electrical contact 332a and the inner terminal of bottom coil 314 without conductive trace 336a intersecting the windings of bottom coil 314. Similarly, conductive trace 334a may be positioned in a layer of isolator 300 below bottom coil 310, in some embodiments. In contrast, some embodiments may have one or more conductive traces positioned in the same layer of the isolator as one or more coils. For example, conductive trace 336b may be positioned in the same layer as bottom coil 314. Such a configuration may be suitable because conductive trace 336a may not intersect any windings of bottom coil 314 to form an electrical connection between the outer terminal of bottom coil 314 and electrical contact 332b. Similarly, conductive trace 334b may be positioned in the same layer as bottom coil 310.

In some embodiments, connecting the top coils of back-to-back transformers may involve connecting an inner terminal of a first top coil to the outer terminal of a second top coil and connecting the outer terminal of the second top coil to the inner terminal of the first top coil. Such a configuration may provide a desired amount of signal balance during operation.

Some embodiments relate to multi-channel integrated isolator devices where individual channels have a back-to-back configuration by connecting two isolators in series according to the techniques described herein. The multiple channels may be connected to different external circuitry and used to perform different operations, for example by using one channel to transfer one signal to one circuit and using another channel to transfer a different signal to a separate circuit. According to aspects of the present application, the multiple channels may be positioned on the same single substrate. In packaging the multi-channel isolator, both the substrate on which the back-to-back isolators are formed and circuit(s) acting as either an input or an output to the isolators are positioned on the same lead frame. In this manner, the back-to-back isolator configurations described herein may allow for less overall packaging footprint (packaging lateral space) because a separate lead frame may not be necessary for both input and output circuits.

Figure 4:
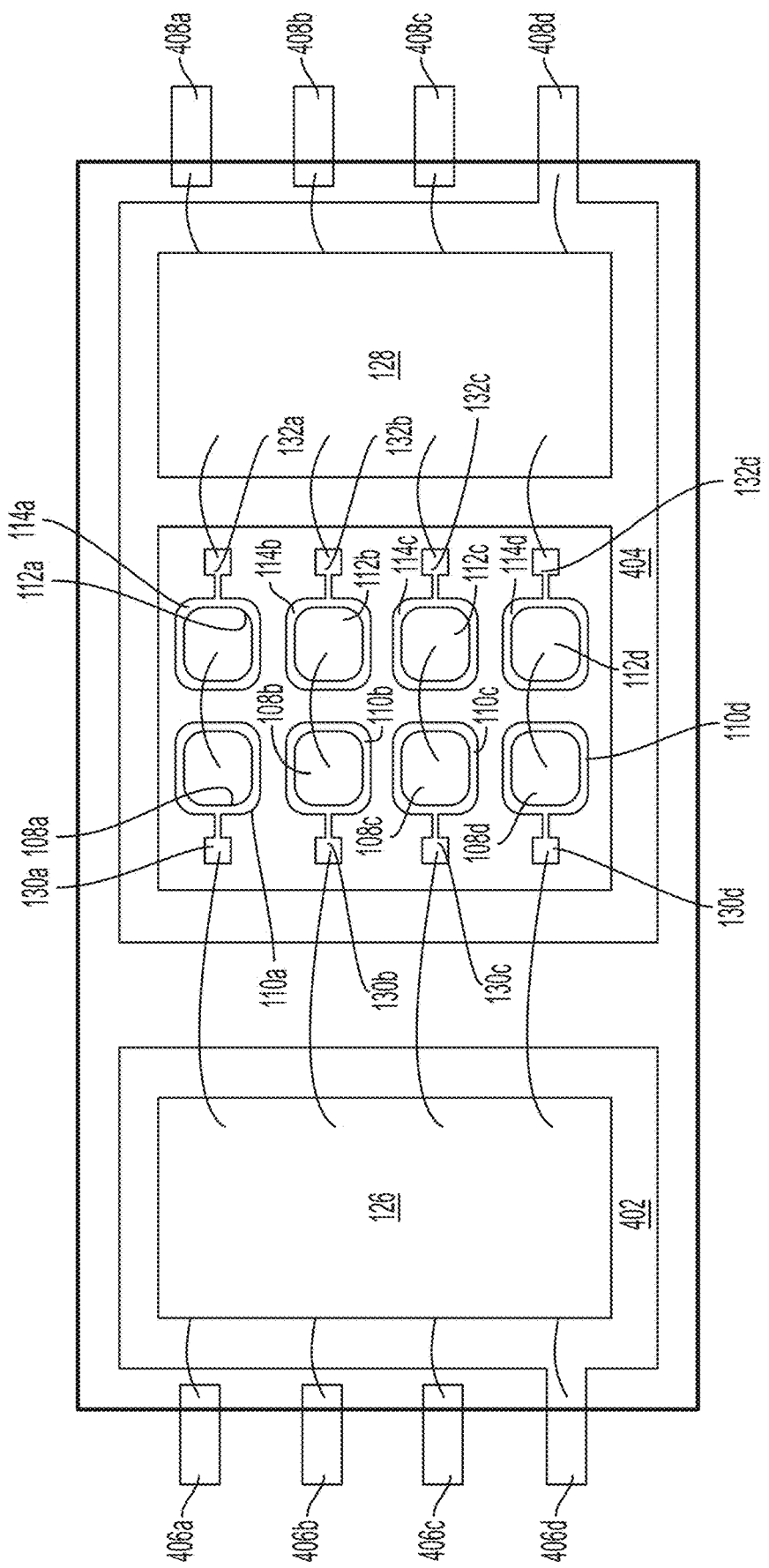
FIG. 4 is a top view of an integrated isolator device positioned on a lead frame and connected to two circuits.

FIG. 4 shows a planar view of an exemplary multi-channel isolator device. Although FIG. 4 shows four channels, it should be appreciated that any suitable number of channels may be formed. In the multi-channel isolator device shown in FIG. 4, each of the channels includes an isolator having a back-to-back configuration of integrated isolator device 100 shown in FIGS. 1A and 1B. One channel includes the integrated isolator device having top isolator components 108a, 112a, bottom isolator components 110a, 114a, which are connected to electrical contacts 130a, 132a, respectively. A second channel includes the integrated isolator device having top isolator components 108b, 112b, bottom isolator components 110b, 114b, which are connected to electrical contacts 130b, 132b, respectively. Similarly, a third channel includes the integrated isolator device having top isolator components 108c, 112c, bottom isolator components 110c, 114c, which are connected to electrical contacts 130c, 132c, respectively. A fourth channel includes the integrated isolator device having top isolator components 108d, 112d, bottom isolator components 110d, 114d, which are connected to electrical contacts 130d, 132d, respectively. Substrate 116, on which all four back-to-back isolators are formed, is positioned on lead frame 404. In particular, substrate 116 may be positioned on a paddle portion 410 of lead frame 404. One set of bottom isolator components, including bottom isolator components 114a, 114b, 114c, 114d is connected to circuit(s) 128, and the other set of bottom isolator components, including bottom isolator components 110a, 110b, 110c, 110d is connected to circuit(s) 126. As shown in FIG. 4, circuit(s) 126 is positioned on lead frame 402, which is separate from lead frame 404. Both substrate 116 and circuit(s) 128 are positioned on lead frame 404. Lead frames 402 and 404 have lead frame fingers for making external connections. Specifically, lead frame 402 has fingers 406a, 406b, 406c, 406d, which may each connect one of the respective four channels to external circuitry. Lead frame 404 has fingers 408a, 408b, 408c, 408d, which may each connect one of the respective four channels to external circuitry.

Examples of conductive materials that may be used to form isolator components (e.g., coils, plates) in embodiments of the integrated isolator device described herein, such as isolator components 108, 110, 112, 114, 208, 212; conductive regions 134, 136, 210, and conductive traces, such as conductive traces 334a, 334b. 336a, 336b, include gold and copper, or any other suitable conductive material.

Examples of dielectric materials that may be used in a substrate of the integrated isolator device described herein, such as substrate 106, include silicon dioxide and polyimide. In some embodiments, the substrate of the integrated device may be a silicon substrate and may include an insulating material (e.g., polyimide) over the silicon substrate.

A non-limiting example of a dielectric material that may be used for dielectric material 116 of the integrated isolator device described herein is polyimide.

The back-to-back integrated isolator devices described herein may be used in various applications. For example, consumer electronics, energy, healthcare, industrial, automotive, medical, aerospace, security, communications, and instrumentation applications may all make use of the technology described here. For example, data transfer and/or power transfer between galvanically isolated systems may be accomplished with the integrated isolator devices described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be a back-to-back integrated isolator device of any of the types described herein, and the isolated signal path may be analog or digital.

As another example, industrial equipment may be isolated from a control system controlling the equipment. For example, high wattage motors may be isolated from control systems controlling their operation by an integrated isolator device of the types described herein. The control systems may operate at a lower wattage than the high wattage motors used by the industrial equipment. The isolator may be disposed on a circuit board on which various circuit components connected to the motors and/or control equipment are included.

Figure 5:
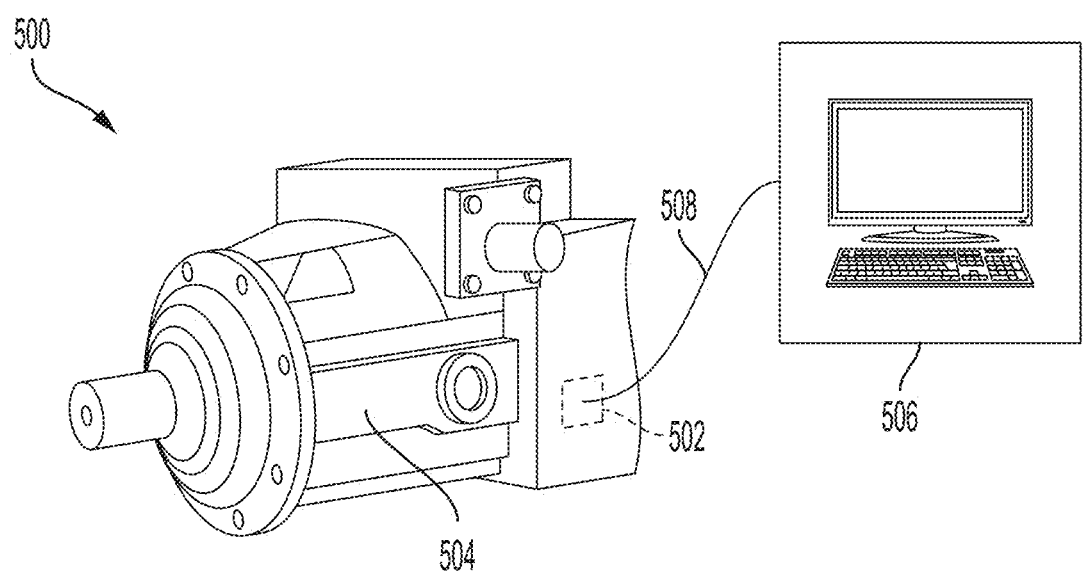
FIG. 5 is a schematic diagram showing an exemplary application of using an integrated isolator device of the types described herein for providing power isolation between an industrial apparatus and a computing device.

FIG. 5 is a schematic diagram showing an exemplary application of using an integrated isolator device of the types described herein for providing power isolation between an industrial apparatus and a computing device. In particular, system 500 includes integrated isolator device 502, which may isolate a comparatively high voltage device from a comparatively low voltage device. In the example shown in FIG. 5, integrated isolator device 502 connects industrial motor 504 to computing device 506 via cable 508. The computing device 506 may be a personal computer (PC), a server, or another computing device. Although isolator 502 is depicted as being integrated as part of industrial motor 504, isolator 502 may be in practice arranged as a separate component connected to both industrial motor 504 and computing device 506. Other such devices may also make use of the integrated isolator devices described herein. For example, instead of industrial motor 504, integrated isolator device 502 may be used for voltage isolation between a turbine and computing device 506.

Other uses of the integrated isolator devices described herein are also possible, as those examples described are non-limiting.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A monolithic integrated isolator device comprising:
a single substrate;
a first isolator component and a second isolator component positioned over the single substrate;
a third isolator component positioned over the first isolator component;
a fourth isolator component positioned over the second isolator component; and
at least one conductor connecting the third isolator component to the fourth isolator component.

2. An apparatus, comprising a paddle portion of a lead frame and the monolithic integrated isolator device of claim 1, wherein the monolithic integrated isolator device is positioned on the paddle portion of the lead frame, and wherein a capacitance between the third isolator component and the paddle portion is less than a capacitance between the first isolator component and the third isolator component.

3. The monolithic integrated isolator device of claim 1, wherein both the third isolator component and the fourth isolator component are electrically isolated from the single substrate.

4. The monolithic integrated isolator device of claim 1, wherein the third isolator component has a smaller lateral area than the first isolator component.

5. The monolithic integrated isolator device of claim 1, wherein a lateral dimension of the third isolator component is smaller than a lateral dimension of the first isolator component.

6. The monolithic integrated isolator device of claim 1, wherein the third isolator component has a periphery that is, at least partially, within a periphery of the first isolator component.

7. The monolithic integrated isolator device of claim 1, further comprising a first electrical contact coupled to the first isolator component and a second electrical contact coupled to the second isolator component.

8. The monolithic integrated isolator device of claim 1, further comprising a first region of dielectric material positioned between the first isolator component and the third isolator component.

9. The monolithic integrated isolator device of claim 8, further comprising a second region of dielectric material positioned between the single substrate and the first isolator component.

10. The monolithic integrated isolator device of claim 1, wherein an area of overlap between the third isolator component and the first isolator component is different than an area of overlap between the fourth isolator component and the second isolator component.

11. A monolithic integrated isolator device comprising:
a single substrate;
a first isolator component and a second isolator component positioned over the single substrate;
at least one third isolator component configured to electromagnetically couple with the first isolator component and the second isolator component, wherein the first isolator component and the second isolator component are positioned between the at least one third isolator component and the single substrate;
a first electrical contact coupled to the first isolator component; and
a second electrical contact coupled to the second isolator component.

12. The monolithic integrated isolator device of claim 11, wherein the at least one third isolator component includes a first conductive region that overlaps, at least partially, with the first isolator component, a second conductive region that overlaps, at least partially, with the second isolator component, and a third conductive region connected to both the first conductive region and the second conductive region.

13. The monolithic integrated isolator device of claim 12, wherein the first conductive region, the second conductive region, and the third conductive region are formed in a layer of the monolithic integrated isolator device.

14. The monolithic integrated isolator device of claim 12, wherein the third conductive region has a smaller lateral dimension than the first conductive region.

15. The monolithic integrated isolator device of claim 11, wherein the first isolator component is electrically isolated from the second isolator component, and the first isolator component is configured to operate at a first voltage and the second isolator component is configured to operate at a second voltage different than the first voltage.

16. A system comprising:
   a monolithic isolator comprising:
      a single substrate;
      a first isolator component and a second isolator component positioned over the single substrate; and
      at least one third isolator component positioned over the first isolator component and the second isolator component;
   at least one first circuit coupled to the first isolator component and configured to operate in a first voltage domain; and
   at least one second circuit coupled to the second isolator component and configured to operate in a second voltage domain different than the first voltage domain.

17. The system of claim 16, further comprising a lead frame having a paddle portion, wherein the monolithic isolator is disposed at least partially on the paddle portion, and wherein a capacitance between the at least one third isolator component and the paddle portion is less than a capacitance between the first isolator component and the at least one third isolator component.

18. The system of claim 16, wherein the at least one third isolator component is electrically isolated from the single substrate.

19. The system of claim 16, further comprising a lead frame, wherein the at least one first circuit and the monolithic isolator are positioned on the lead frame.

20. The system of claim 16, wherein the at least one first circuit includes a transmitter or a receiver and the at least one second circuit includes a transmitter or a receiver.

* * * * *